*(12)* United States Patent
Maus et al.

(10) Patent No.: US 10,502,047 B2
(45) Date of Patent: Dec. 10, 2019

(54) RESERVOIR RECOVERY SIMULATION PROCESS AND SYSTEM

(71) Applicant: MAGNETIC VARIATION SERVICES LLC, Westminster, CO (US)

(72) Inventors: Stefan Maus, Boulder, CO (US); Jarrod Shawn DeVerse, Greenwood Village, CO (US)

(73) Assignee: Magnetic Variation Services LLC, Denver, CO (US)

( * ) Notice: Subject to any disclaimer, the term of this patent is extended or adjusted under 35 U.S.C. 154(b) by 759 days.

(21) Appl. No.: 15/199,706

(22) Filed: Jun. 30, 2016

(65) Prior Publication Data

US 2017/0002631 A1 Jan. 5, 2017

Related U.S. Application Data

(60) Provisional application No. 62/187,207, filed on Jun. 30, 2015.

(51) Int. Cl.
*G06G 7/48* (2006.01)
*E21B 47/02* (2006.01)
*G01V 11/00* (2006.01)
*E21B 49/00* (2006.01)
*G06F 17/50* (2006.01)

(52) U.S. Cl.
CPC ............. *E21B 47/02* (2013.01); *E21B 49/00* (2013.01); *G01V 11/00* (2013.01); *G01V 11/005* (2013.01); *G06F 17/5009* (2013.01)

(58) Field of Classification Search
None
See application file for complete search history.

(56) References Cited

U.S. PATENT DOCUMENTS

| | | | |
|---|---|---|---|
| 6,549,879 B1* | 4/2003 | Cullick | E21B 49/00 702/11 |
| 8,135,541 B2* | 3/2012 | Davis | E21B 47/022 166/255.2 |
| 2004/0122640 A1* | 6/2004 | Dusterhoft | E21B 49/006 703/10 |
| 2007/0156377 A1* | 7/2007 | Gurpinar | E21B 43/00 703/10 |
| 2010/0185427 A1* | 7/2010 | Tilke | E21B 43/00 703/10 |
| 2010/0307742 A1* | 12/2010 | Phillips | E21B 47/022 166/250.01 |
| 2011/0024126 A1* | 2/2011 | Brouwer | E21B 43/30 166/369 |
| 2011/0088895 A1* | 4/2011 | Pop | E21B 7/04 166/254.2 |
| 2011/0172976 A1* | 7/2011 | Budiman | E21B 47/022 703/2 |

(Continued)

OTHER PUBLICATIONS

Wang et al. Using Production Logs to Calibrate Horizontal Wells in Reservoir Simulation SPE 110412, SPE International, Society of Petroleum Engineers, 2007 (Year: 2007).*

*Primary Examiner* — Kibrom K Gebresilassie
*Assistant Examiner* — Cuong V Luu
(74) *Attorney, Agent, or Firm* — Vinson & Elkins LLP

(57) ABSTRACT

A method and system for simulating reservoir recovery include taking into account inaccuracies in well spacing due to wellbore positional uncertainty.

19 Claims, 10 Drawing Sheets

(56) References Cited

U.S. PATENT DOCUMENTS

| | | | |
|---|---|---|---|
| 2014/0136117 A1* | 5/2014 | Banian | E21B 43/305 |
| | | | 702/12 |
| 2015/0019134 A1* | 1/2015 | Sawaryn | E21B 47/022 |
| | | | 702/6 |
| 2015/0260016 A1* | 9/2015 | Fung | G01V 99/005 |
| | | | 703/10 |
| 2016/0215606 A1* | 7/2016 | Okoroafor | E21B 49/003 |
| 2016/0282513 A1* | 9/2016 | Holmes | E21B 47/022 |
| 2018/0045031 A1* | 2/2018 | Shaposhnikov | E21B 33/14 |

* cited by examiner

RESERVOIR RECOVERY SIMULATION PROCESS AND SYSTEM

CROSS-REFERENCE TO RELATED APPLICATIONS

This application claims the benefit of U.S. Provisional Application No. 62/187207, filed 30 Jun. 2015.

BACKGROUND

Oil and gas wells are often drilled horizontally through non-permeable shale formations. In order to extract the hydrocarbons from these formations, the shale rock is hydraulically fractured to enable fluid flow. The resulting fractures extend radially from the wellbore for a limited distance, which creates a production envelope around the wellbore. Since this envelope covers a finite volume, it is necessary to drill multiple horizontal wells within a reservoir in order to recover the full potential of the available hydrocarbons. The spacing between the drilled wellbores is usually determined by the estimated fracture propagation distance that extends outward from the wellbore. Ideally, wellbores should be placed so that the entire space between wellbores is fractured without any overlap. However, there is significant uncertainty in wellbore position when determined from traditional directional surveying technologies. This makes it quite challenging to place wellbores at precise spacing intervals unless operators use enhanced survey management solutions that reduce the positional uncertainty of the wellbore.

Measurement While Drilling (MWD) and Gyro tools are the most commonly used directional surveying instruments for determining wellbore position. These tools have numerous error sources that can cause significant inaccuracies in survey measurements and wellbore placement. FIGS. 1A and 1B show an example of how wells that were planned to be parallel (14 in FIG. 1A) may actually end up meandering off plan (14' in FIG. 1B), due to standard surveying errors, leading to unclaimed resources (16 in FIG. 1B) in the reservoir where the wells diverge and neighboring wells (18 in FIG. 1B) competing for the same production envelope. Even though it is known that survey error impacts wellbore placement in a reservoir, survey error is generally not considered when planning well production. This means that the impact of wellbore placement errors on reservoir recovery for different surveying methods is often unknown and not taken advantage of when selecting the survey method to use in drilling the wellbores.

SUMMARY

A method and system for simulating reservoir recovery that accounts for inaccuracies in well spacing due to wellbore positional uncertainty are disclosed herein. In one aspect, the method of simulating reservoir recovery includes receiving a request including input parameters for a reservoir recovery simulation. The input parameters include a description of a reservoir, a description of planned wells, and one or more tool codes, where each tool code corresponds to a survey tool error model. The method includes developing a model of the reservoir from the input parameters. The method includes computing an ideal recovery for the reservoir assuming the planned wells are drilled accurately in the reservoir model. The method includes simulating an actual recovery for the reservoir a plurality of times for each tool code. Each simulation includes generating actual wellbore trajectories in the reservoir model taking into account wellbore positional uncertainty specified by the survey error tool model corresponding to the tool code and computing a simulated recovery from simulated wells having the actual wellbore trajectories. The method includes computing a simulated recovery loss for each simulation from the difference between the simulated recovery computed during the simulation and the ideal recovery. The method includes computing an average recovery loss for each tool code from the simulated recovery losses. The method includes at least one of updating a display with the average recovery loss for each tool code and storing the average recovery loss for each tool code in a non-transitory computer readable medium.

BRIEF DESCRIPTION OF DRAWINGS

The following is a description of the figures in the accompanying drawings. The figures are not necessarily to scale, and certain figures and certain views of the figures may be shown exaggerated in scale or in schematic in the interest of clarity and conciseness.

DETAILED DESCRIPTION

There are numerous error sources associated with MWD survey measurements and each error source contributes in some form to the magnitude of uncertainty that propagates along the computed wellbore trajectory. The Industry Steering Committee for Wellbore Survey Accuracy (ISCWSA) developed a framework for quantifying the magnitude of uncertainty. The ISCWSA's work resulted in an error model which is described in detail by Williamson (Williamson, H. S. 2000. Accuracy Prediction for Directional Measurement While Drilling. SPEDC 15 (4): 221-233). The Operator's Wellbore Survey Group (OWSG), a sub-committee of the ISCWSA, continued development on the original error model and publishes a set of Instrument Performance Models that enables the computation of ellipses of uncertainty for specific surveying methods. This consolidated set is referred to as the OWSG set of tool codes, or Tool Codes.

Figure 1A:
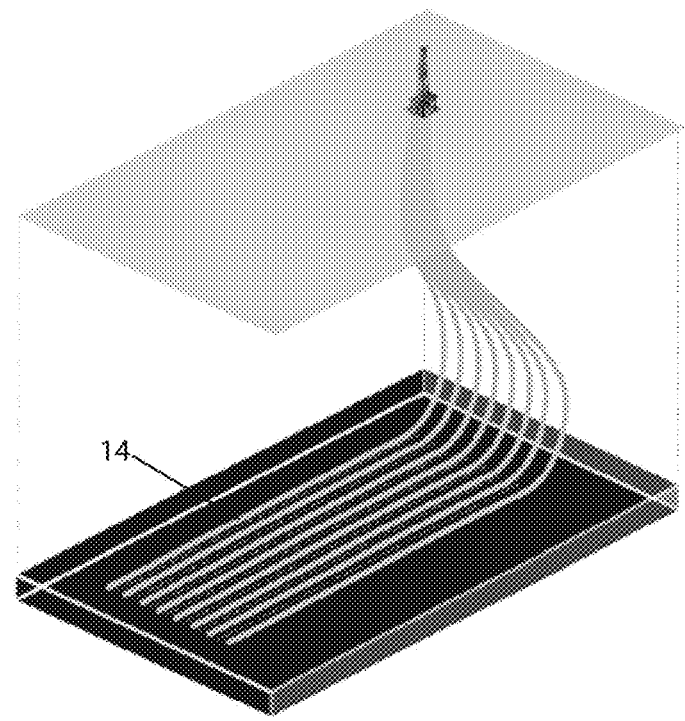
FIG. 1A shows an example of planned wells.
Figure 1B:
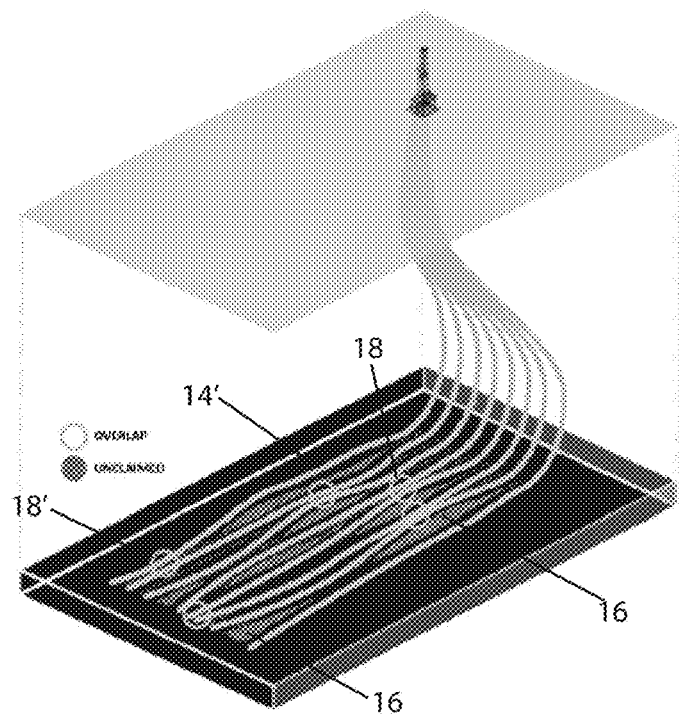
FIG. 1B shows an example of actual wells that may be drilled instead of the planned wells in FIG. 1A due to standard surveying errors.
Figure 2:
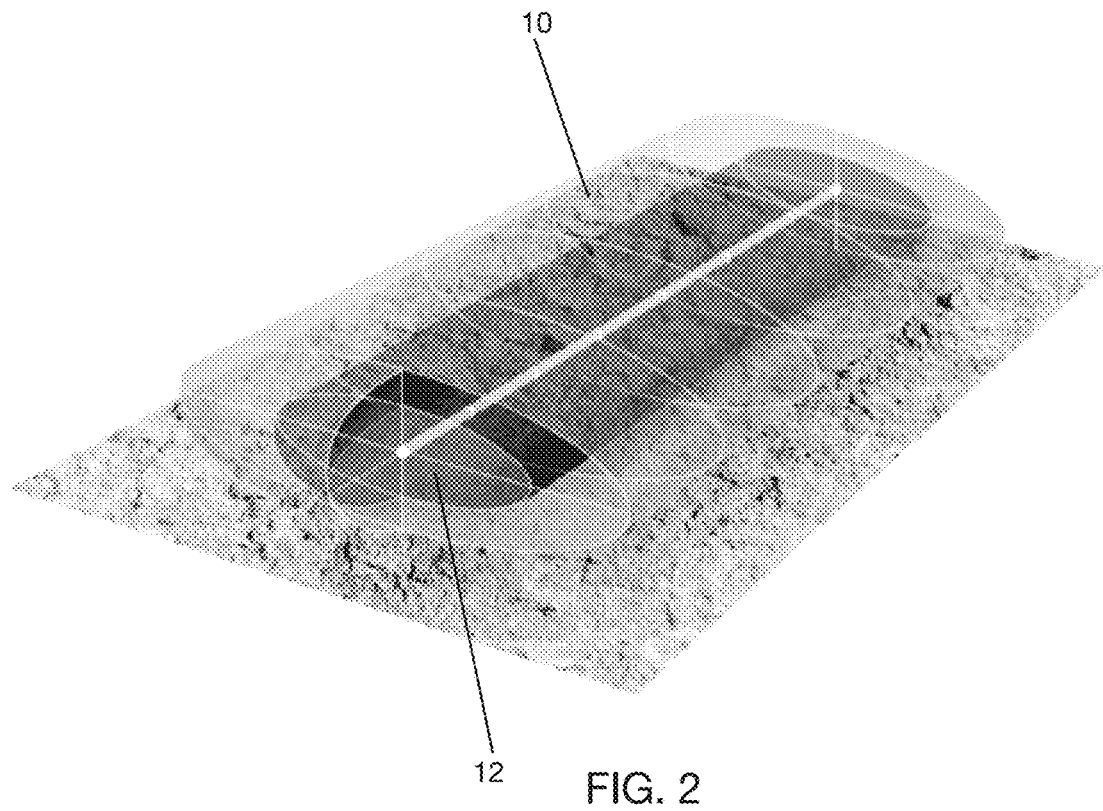
FIG. 2 shows ellipses of uncertainty for standard MWD and enhanced survey using advanced corrections.

There are two primary surveying choices affecting survey accuracy: The quality of the chosen geomagnetic reference model and the level of corrections applied to the survey data. Table 1 lists the source of the geomagnetic field in the leftmost column and shows how they are represented in the available reference models, increasing in accuracy from the left to the right column. Table 2 provides a corresponding list of the available survey corrections which are accounted for in the OWSG error models, again improving in accuracy from the left to the right. These differences in survey accuracy are illustrated in FIG. 2, which shows the difference between an ellipse of uncertainty 10 for standard MWD and an ellipse of uncertainty 12 for advanced corrections using MWD+IFR2+MS+SAG. As shown in FIG. 2, the ellipse of uncertainty 10 for standard MWD is much larger than the ellipse of uncertainty 12 for advanced corrections using MWD+IFR2+MS+SAG.

TABLE 1

|  | IGRF/WMM | BGGM | MVHD | IFR1 | IFR2 |
| --- | --- | --- | --- | --- | --- |
| Main Field | X | X | X | X | X |
| Annual Update |  | X | X | X | X |
| Global Crustal Field |  |  | X | X | X |
| Local Crustal Field |  |  |  | X | X |
| Local Disturbance Field |  |  |  |  | X |

IGRF = International Geomagnetic Reference Field
WMM = World Magnetic Model
BGGM—British Global Geomagnetic Model
MVHD = MagVAR's High Definition Model of the Earth's magnetic field
IFR1 = In-Field Referencing of type 1, which includes local crustal anomalies
IFR2 = In-Field Referencing of type 2, which further includes natural disturbance fields

TABLE 2

| Example Tool Codes | MWD + IFR1 + AX | MWD + IFR1 + MS | MWD + IFR2 + SAG + MS |
| --- | --- | --- | --- |
| Axial Interference | X | X | X |
| Cross-axial interference, instrument biases and scale factors |  | X | X |
| Bottomhole Assembly ("BHA") Sag |  |  | X |

In this disclosure, a recovery simulator for a reservoir takes into account inaccuracies in well spacing due to wellbore positional uncertainty associated with OWSG Tool Codes. The recovery simulator enables the economic impact of using different surveying methods with different surveying accuracies to be estimated. The recovery simulator simulates actual wellbore trajectories using randomization at each survey station based on the error assumptions from Tool Codes. The recovery simulator uses the resulting random simulated trajectories as a realistic scenario of how the wells would actually be drilled. For each scenario, the recovery simulator computes the expected hydrocarbon recovery. By repeating the simulation for different Tool Codes and/or different wellbore layouts, the economic impact of wellbore layout and surveying method on well production can be assessed.

Figure 3A:
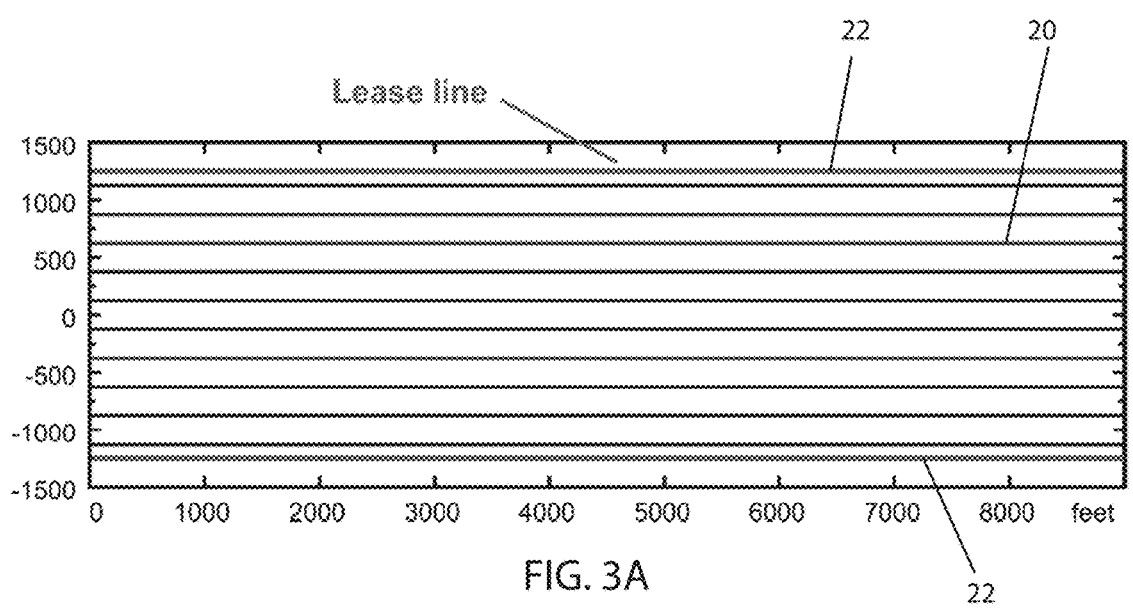
FIG. 3A shows planned well paths for a reservoir section.
Figure 3B:
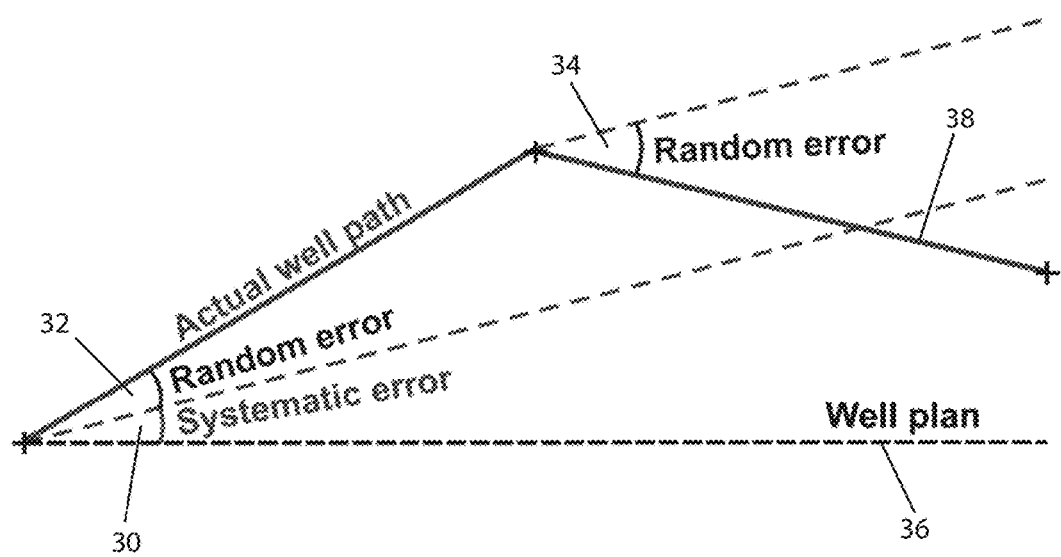
FIG. 3B shows well path simulation of systematic and random errors.
Figure 3C:
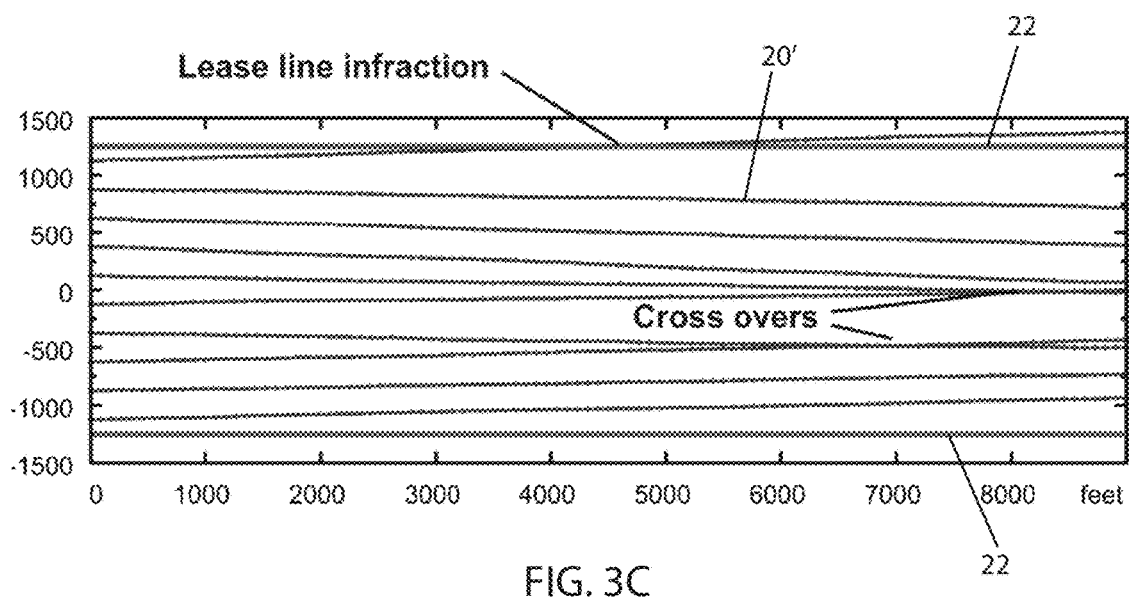
FIG. 3C shows simulated actual well paths generated for the planned well paths of FIG. 3A when survey errors are taken into consideration.

For illustration purposes, FIG. 3A shows a well plan for a sample project with ten wells 20 drilled at 250 feet spacing within a 2500 feet by 9000 feet development area. The wells 20 are shown as parallel lines between lease lines 22. The recovery simulator generates realistic wellbore trajectories using randomization at each survey station based on the error statistics specified by the Tool Codes. This may be performed as follows: For every wellbore, the recovery simulator generates a single systematic azimuth error value using a random generator scaled to the appropriate tool error model. The systematic azimuth error value is illustrated by the dashed line 30 in FIG. 3B. The recovery simulator also generates a random error scaled to the random azimuth error of the Tool Code at each survey station. The random error is indicated at 32 and 34 for two survey stations. In FIG. 3B, the line 36 indicates the planned (ideal) well trajectory. Line 38 indicates the actual well trajectory after applying the systematic azimuth error and random error. By applying the systematic azimuth error and random error at each survey station, ten meandering wellbore trajectories are generated. FIG. 3C shows an example of simulated wellbore trajectories 20' generated by applying systematic azimuth error and random error at each survey station. Wellbore crossovers, i.e., where well paths cross each other, and lease line crossings, i.e., where well paths cross the lease lines 22, can be observed in FIG. 3C. The recovery simulator can compute the number of times these crossovers and crossings occur. Repeating the simulation a large number of times will enable a statistical assessment of the impact of wellbore placement accuracy on recovery, wellbore crossovers, and lease line crossings.

In one embodiment, the recovery simulator receives input parameters from a user. The input parameters contain sufficient information to simulate recovery with wellbore positional uncertainty. Table 3 below shows an exemplary list of input parameters that may be provided to the recovery simulator.

TABLE 3

| Input Parameters | Components |
| --- | --- |
| Reservoir | Slab width |
|  | Azimuth |
| Wellbore layout | Number of Wells |
|  | Wellbore spacing |
|  | Lateral length |
|  | Distance from outer wellbores to lease lines |
| Wellbore placement | Tool Codes |
|  | Landing Point Uncertainty |
|  | Survey Interval |
| Production | Drainage (or frac) radius |
|  | Ideal recovery |

The input parameters may be provided to the recovery simulator through a graphical user interface with appropriate fields for entry of data. Alternatively, the input parameters may be provided by uploading a suitably formatted file through the graphical user interface. After the user enters the input parameters through the graphical user interface, the user may click a simulate recovery button on the graphical user interface to start the recovery simulator.

The recovery simulator receives the input parameters and uses the input parameters in simulation of reservoir recovery. In general, the recovery simulator computes the total ideal recovery for the reservoir described in the input parameters. For each Tool Code (also, survey error model or survey method) specified in the input parameters, the recovery simulator simulates actual recovery by generating actual wellbore trajectories taking into account wellbore positional uncertainty associated with the Tool Code. The reservoir also computes the simulated recovery from wells having the actual wellbore trajectories. The simulation is repeated several times, e.g., 100 or more times, to achieve a statistically significant distribution of wellbores. For each simulation, a simulated recovery loss is computed by comparing the simulated recovery to the total ideal recovery.

Figure 4A:
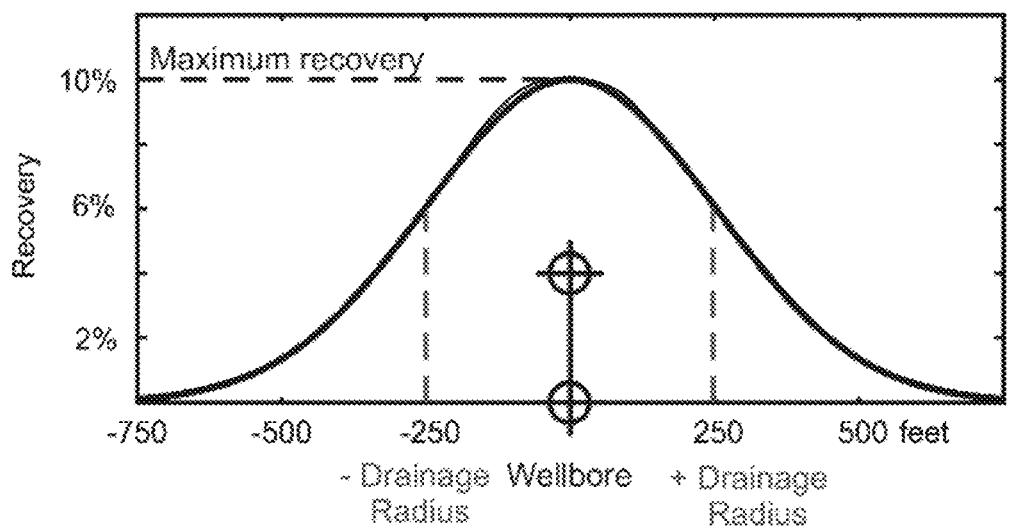
FIG. 4A shows a production profile for a single wellbore as a Gaussian bell curve.

Central to operation of the recovery simulator is how to define the production envelopes and compute recovery. In general, actual production does not occur from a fixed volume around the wellbore. In one embodiment, an assumption is made that most of the production occurs within a formation-specific drainage radius, with exponential fall-off with distance. This assumption can be represented by a Gaussian bell shaped curve with inflection points defined by a single parameter, i.e., the drainage radius. A production envelope based on this assumption is illustrated for a single wellbore in FIG. 4A. Production for the single wellbore can be determined by projecting a production profile described by a Gaussian bell curve perpendicular to the wellbore trajectory and integrating the projected production profile along the well path to determine an ideal recovery number. The bell curve width is scaled so that the one standard deviation is equal to the drainage radius specified in the input parameters. An ideal recovery coefficient may be computed so that the ideal recovery specified in the input parameters is equal to the ideal recovery number multiplied by the ideal recovery coefficient.

Figure 4B:
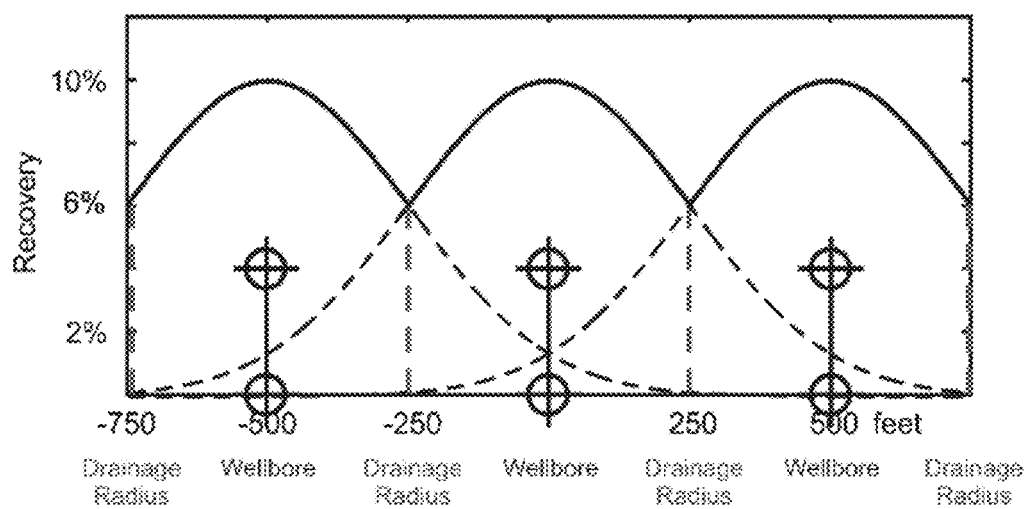
FIG. 4B shows overlapping of ideal production profiles for multiple wellbores.
Figure 4C:
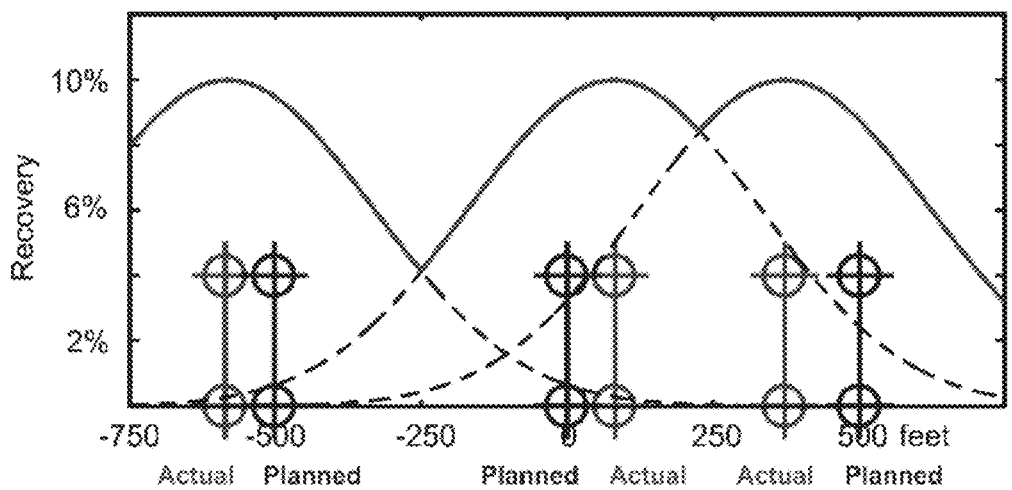
FIG. 4C shows overlapping of actual production profiles for multiple wellbores.
Figure 4D:
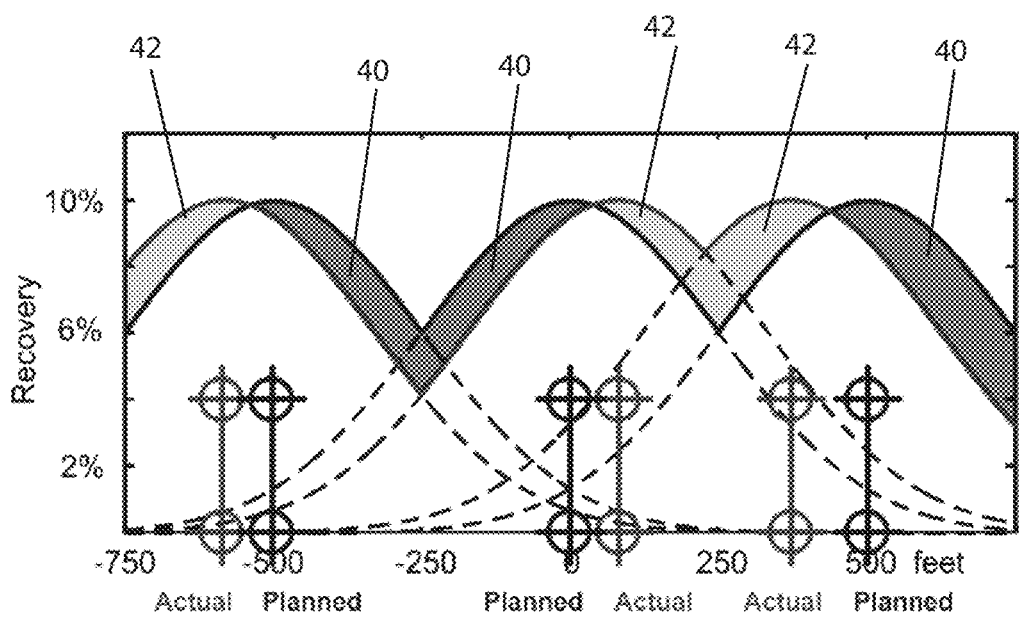
FIG. 4D shows the difference between planned recovery and actual recovery.

When the wellbores are placed apart at a distance specified in the input parameters, overlap of the production envelopes will occur. FIG. 4B illustrates overlap of production profiles for three example wellbores spaced apart by a distance equal to twice the drainage radius. In one embodiment, an assumption is made that total recovery from the overlapping wellbores is identical to the maximum value of the production envelopes of any of the wellbores. The production envelopes in FIG. 4B do not take into account wellbore positioning errors and assume that the wells are drilled accurately. FIG. 4C shows an example of actual production envelopes when wellbore positioning errors are taken into consideration. FIG. 4D shows the actual production envelopes of FIG. 4C superimposed on the ideal production envelopes of FIG. 4B. The shaded areas 40 between the production envelopes correspond to lost production, and the shaded areas 42 between the production envelopes correspond to increased production. The net recovery loss due to wellbore positioning errors can be determined by comparing the lost production and increased production.

Figure 5A:
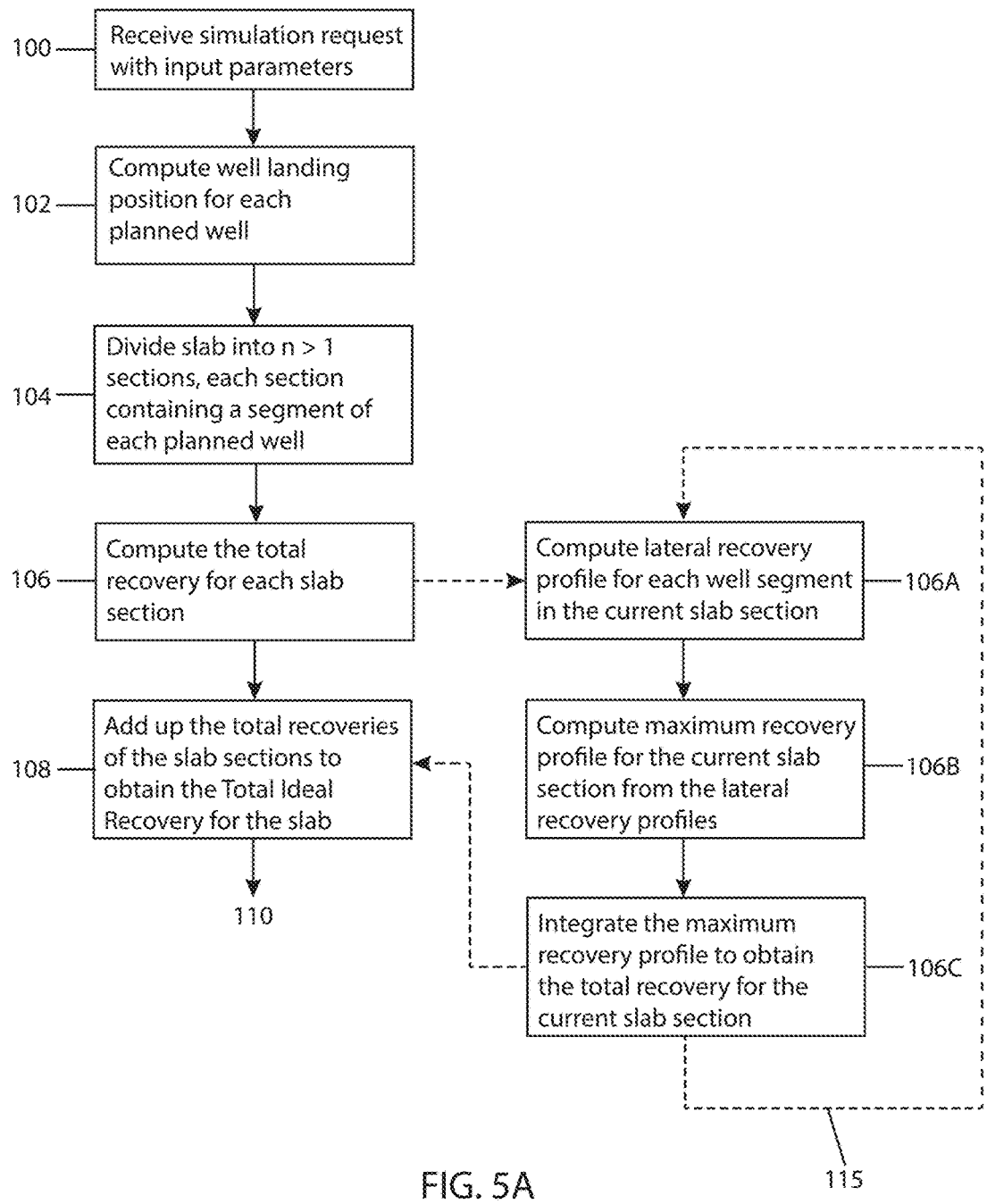
FIGS. 5A-5C is a flowchart illustrating a process of simulating reservoir recovery.
Figure 5B:
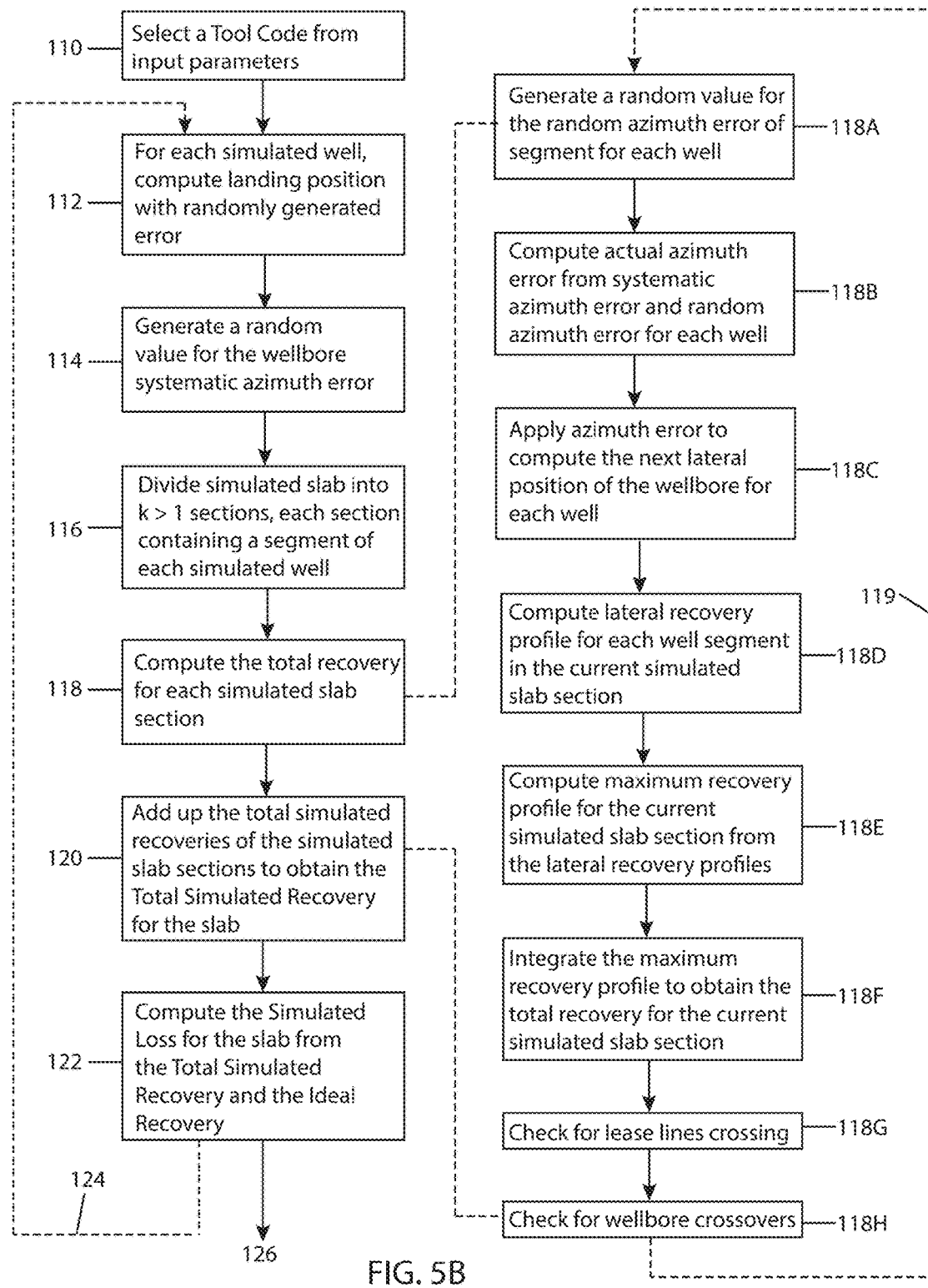
Figure 5C:
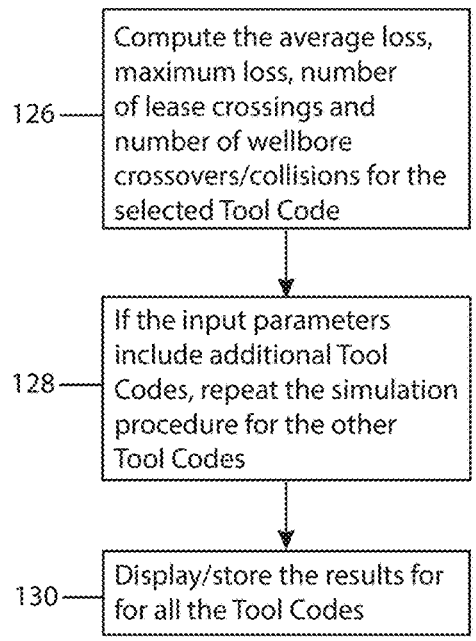

A flow chart of an example recovery simulator process according to this disclosure is shown in FIGS. 5A-5C.

Referring to FIG. 5A, at 100, a request to start a recovery simulation is received. The request may be made through a graphical user interface of a client device. The request includes input parameters that will drive the recovery simulation. In one embodiment, the input parameters include the components shown in Table 3. However, the recovery simulator is not limited to the particular input parameters shown in Table 3. The reservoir simulator develops a model of the reservoir from the input parameters. This may include, for example, representing the reservoir by a slab having the slab width and azimuth specified in the input parameters.

Figure 6A:
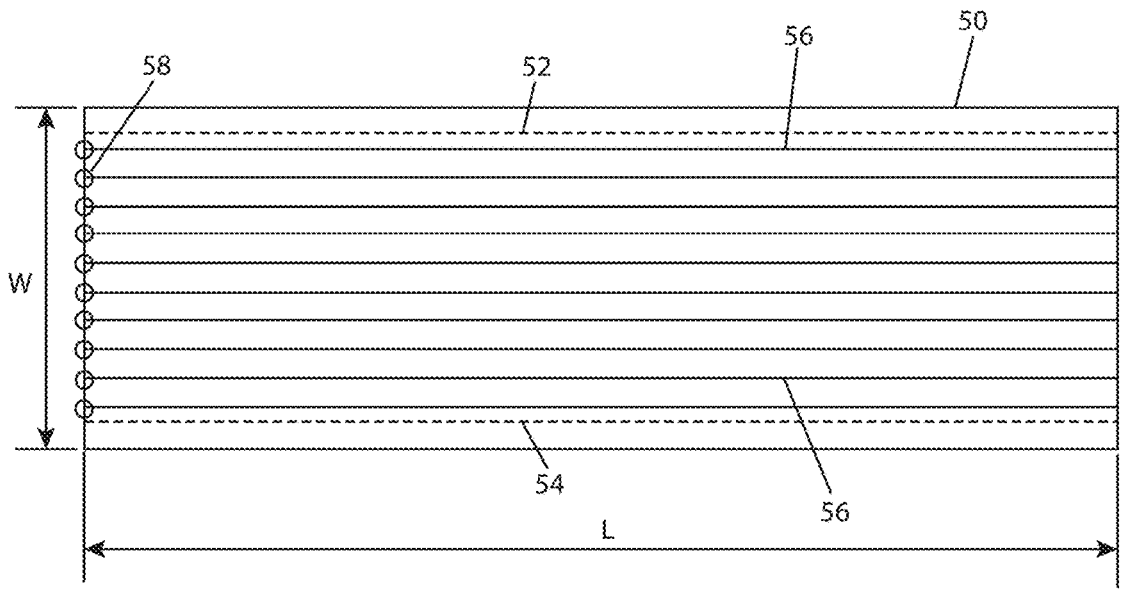
FIG. 6A shows a slab with planned wells.

At 102, a well landing position is computed for each planned well from the input parameters. The well landing position is the beginning of the lateral segment of the well. In one embodiment, the well landing position is determined by the slab width, the lateral length, the number of wells, the wellbore spacing, and the distance from outer wellbores to lease lines specified in the input parameters. For illustration purposes, FIG. 6A shows an example of a slab 50 having a width W. The slab 50 represents a reservoir or reservoir section. The dashed lines 52, 54 are the lease lines. The planned wells 56 are the parallel lines between the lease lines 52, 54. Each planned well has a lateral length L. The well landing position of the planned well 52 is indicated by the circle 58.

Figure 6B:
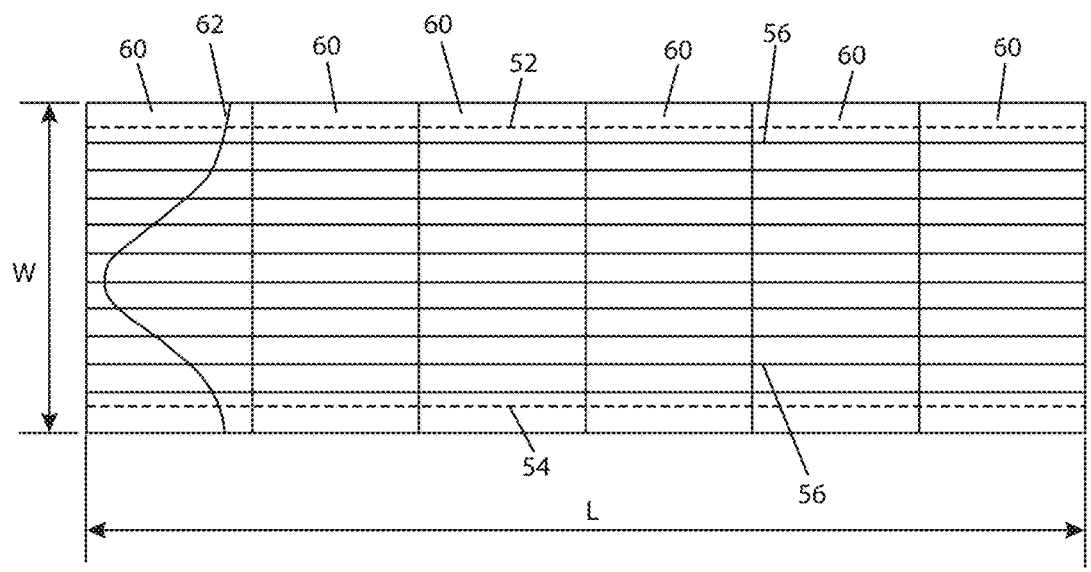
FIG. 6B shows a lateral recovery profile superimposed on a planned well.

Returning to FIG. 5A, at 104, the slab is divided into n>1 sections. The parameter n may be obtained by dividing the lateral length L by the survey interval specified in the input parameters, or the number n may correspond to the number of survey stations. Each slab section will contain a segment of each of the planned wells. FIG. 6B shows an example of dividing the slab 50 into slab sections 60.

Returning to FIG. 5A, at 106, the total recovery for each slab section is computed. Steps 106A through 106C relate to computation of the total recovery for a slab section.

At 106A, a lateral recovery profile is computed for each well segment in the current slab section. The lateral recovery profile is a production profile perpendicular to the wellbore across the entire slab width. The production profile may be described by a Gaussian bell curve as explained above. FIG. 6B shows an example of a lateral recovery profile at 62 for one of the planned wells 52.

Returning to FIG. 5A, at 106B, a maximum recovery profile for the current slab section is computed from the lateral recovery profiles computed at 106A.

At 106C, the maximum recovery profile obtained at 106B is integrated to obtain the total recovery for the current slab section.

Steps 106A through 106C are repeated for each slab section, as shown by line 115, to obtain the total recovery for each slab section. At 108, the total recoveries for the slab sections are added up to obtain the Total Ideal Recovery for the slab. The Total Ideal Recovery is the total recovery for the reservoir, represented by the slab, assuming that the planned wells are drilled accurately. In the next steps, the total (actual) recovery assuming that the planned wells are not drilled accurately will be considered.

For simulation of actual recovery, there will be a simulated well for each planned well. That is, every simulation will involve the same number of simulated wells as the planned wells. Therefore, if there are 10 planned wells, for example, there will also be 10 simulated wells per simulation. Like the planned wells, each simulated well will have a well landing position.

Referring to FIG. 5B, at 110, a Tool Code is selected from the input parameters.

Figure 6C:
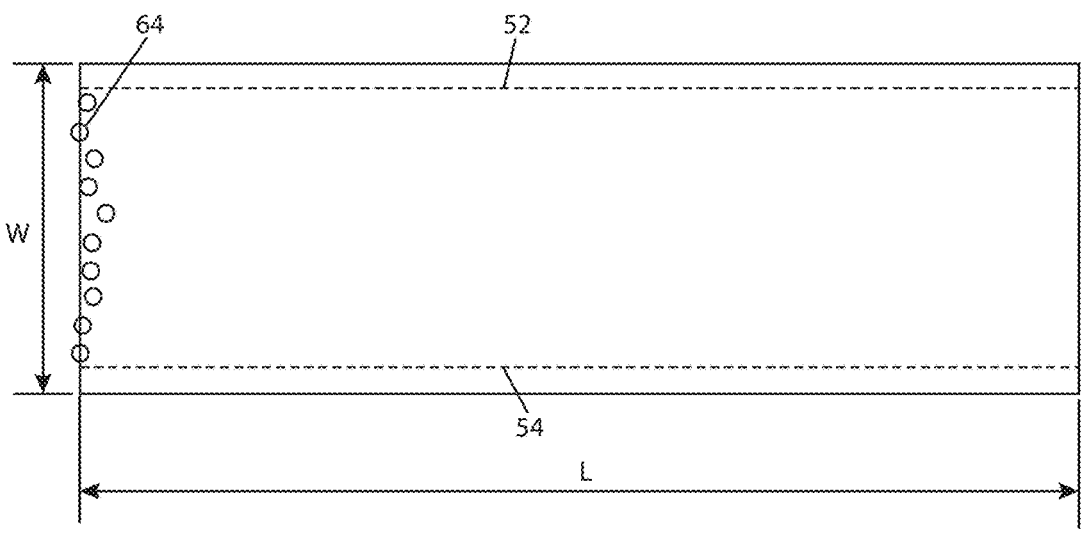
FIG. 6C shows well landing positions computed with landing point uncertainty.

At 112, a well landing position is computed for each simulated well. The well landing position is generated taking into account wellbore landing point uncertainty. To compute the well landing position for a simulated well, a random error is generated and added to the well landing position of the corresponding planned well. For illustration purposes, FIG. 6C shows examples of well landing positions that take landing point uncertainty into account. The well landing positions are represented by the circles 64. The well landing positions 64 of FIG. 6C can be compared to the well landing positions for the planned wells shown in FIG. 6A.

At 114, a systematic azimuth error is generated for each simulated well for a selected Tool Code. In one embodiment, the systematic azimuth error is generated by generating a Gaussian random value scaled to the applicable tool error model. The tool error model is specified by the selected Tool Code at step 110. The tool error model will define the standard deviation of the systematic azimuth error and the standard deviation of the systematic inclination error. The systematic azimuth error generated will have the standard deviation prescribed by the tool error model. The systematic azimuth error gives the same azimuth offset in each section of the wellbore.

At 116, the simulated slab is divided into k>1 sections. The parameter k can be the same as the parameter n in step 104.

At 118, the total simulated recovery for each slab section is computed. Steps 118A through 118H are sub-steps of step 118. Steps 118A through 118C relate to constructing a segment of each wellbore in the current slab section taking into account wellbore positional uncertainties. Steps 118D through 118F relate to computation of the total recovery from the current slab section.

At 118A, a random value for the random azimuth error of the well segment in the current slab section is generated for each well. The tool error model will define the standard deviation of the random azimuth error. In contrast to the systematic azimuth error, this random azimuth error is different for each segment of the wellbore.

At 118B, an actual azimuth error is computed for each well as a sum or other combination of the systematic azimuth error computed at 114 and the random azimuth error computed at 118A.

At 118C, the actual azimuth error computed at 118B is used to compute the next lateral position of each wellbore.

Figure 6D:
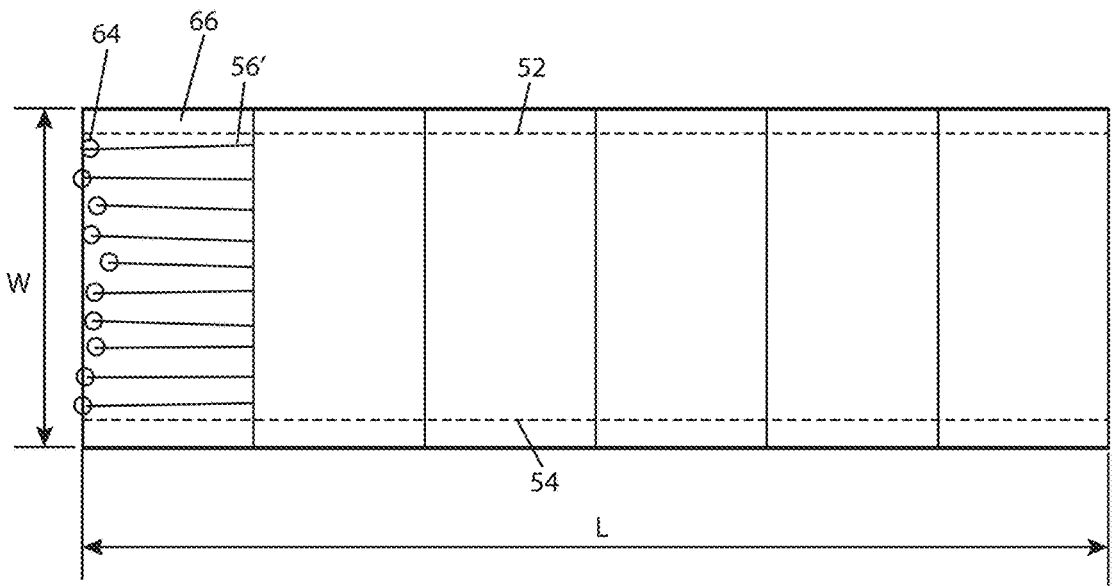
FIG. 6D shows construction of wellbore trajectories with positional uncertainty.

For illustrative purposes, FIG. 6D shows examples of well trajectory segments 56' that may have been generated after steps 118A through 118C have been performed for a slab section 66. It is noted that the well trajectory segments 56' are not parallel like the planned wells 52 once positional uncertainty has been taken into account.

Returning to FIG. 5B, at 118D, a lateral recovery profile is computed for each well segment in the current slab section. This is similar to step 106A (in FIG. 5A) described above, except that the simulated well segments are involved in the computation rather than the planned well segments.

At 118E, a maximum recovery profile for the current slab section is computed from the lateral recovery profiles computed at 118D.

At 118F, the maximum recovery profile obtained at 118E is integrated to obtain the total simulated recovery for the current slab section.

At 118G, a check is made to see if any well trajectories generated at 118C cross over the lease lines. This can be used to determine the expected number of lease line crossings for the current slab section.

At 118H, a check is made to see if any well trajectories generated at 118C intersect each other. This can be used to determine the expected number of wellbore crossovers and wellbore collisions for the current slab section.

Steps 118A through 118H are repeated for all the slab sections, as shown at 119, to obtain a total simulated recovery for each slab section. At 120, the total simulated recoveries are added to obtain the Total Simulated Recovery for the slab.

At 122, Simulated Loss is computed from the difference between the Total Simulated Recovery computed at 120 and the Total Ideal Recovery computed at 108.

Steps 112 through 120 complete one simulation and are repeated several more times, as indicated by line 124, to obtain a statistical significant distribution of simulated wells. In one example, the simulation is repeated at least 100 times. In another example, the simulation is repeated at least 500 times.

Referring to FIG. 5C, at 126, after the simulations have been repeated as many times as desired for the selected Tool Code, the average recovery loss and maximum loss are computed from all the Simulated Losses obtained during each repeat of step 122. The term "average," as used in this disclosure, can mean any of the statistical averages, such as mean, median, mode, or range. Also, the expected number of lease crossings may be computed from the result of step 118G. The expected number of wellbore crossovers and the expected number of wellbore collisions may be computed from the result of step 118H. The expected number of lease crossings, expected number of wellbore crossovers, and expected number of wellbore collisions may be reported as averages or actual counts over the simulations for each selected Tool Code.

At 128, if the input parameters include additional Tool Codes that have not been simulated, the process returns to step 110, selects another Tool Code, and repeats steps 112 through 126.

At 130, the simulation results for all the Tool Codes are displayed and/or stored. The results may include the output parameters computed at 126, i.e., one or more of the average recovery loss, maximum recovery loss, number of lease crossings, number of expected wellbore crossovers, and number of expected wellbore collisions. The results may be displayed in the graphical user interface on the client device, which would allow the user an opportunity to adjust the input parameters and send another request to the system to perform a simulation with the modified parameters.

In simulation of the actual recovery, an assumption is made that geosteering can keep the wellbore in the target layer of the reservoir. In some cases, the target layer may not be easily distinguishable. In these cases, the possibility that vertical inaccuracies will drive the wellbore out of the target zone can be considered. The program may simulate the effect of survey corrections, like SAG, which improve the vertical well placement accuracy. In fact, the inclination error could be simulated by a similar approach to the azimuth error. That is, in one embodiment, step 114 can be expanded to include generating a systematic inclination error for each simulated well for the selected Tool Code. Step 118A can be expanded to include generating a random value for the random inclination error of the well segment in the slab section for each well. Step 118B can be expanded to include computation of an actual inclination error for each well as a sum or other combination of the systematic inclination error and the random inclination error. Step 118C can be expanded to include using the actual inclination error together with the actual azimuth error to compute the next 3D position of each wellbore. A step may be added after step 118H to determine if there are any well trajectories exiting the current slab section in a vertical direction. Step 126 can be expanded to include computation of the expected number of vertical exits from the target zone of the reservoir.

Figure 7:
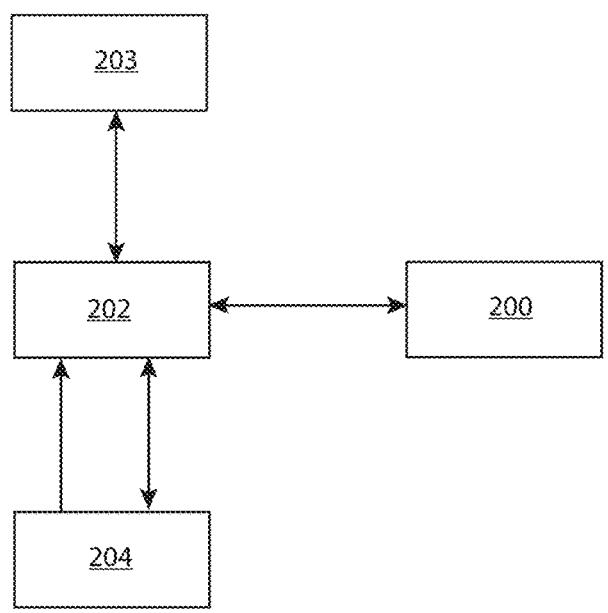
FIG. 7 shows a system for simulating reservoir recovery.

FIG. 7 shows an example of a system including the reservoir simulator. The system includes a non-transitory computer readable medium 200, such as a hard drive, a CD-ROM, a floppy disk, and the like. The non-transitory computer readable medium 200 contains computer readable code. In one embodiment, the computer readable code is configured to perform the reservoir simulator process described above when executed by a processor. The system includes a processor 202 and associated memory 203 for executing the computer readable code stored on the non-transitory computer readable medium 200. The system may communicate with a client device 204, which may display a graphical user interface through which a user can specify input parameters and place a request for reservoir recovery simulation. The client device 204 may be a personal computer, mobile device, or the like. The system may be implemented as a web application, with the graphical user interface displayed in a Web browser on the client device 204 and the processor 202 being part of a server (not shown separately) that communicates with the client device 204 over a network (not shown separately).

While the invention has been described with respect to a limited number of embodiments, those skilled in the art of, having benefit of this disclosure, will appreciate that other embodiments can be devised which do not depart from the scope of the invention as disclosed herein. Accordingly, the scope of the invention should be limited only by the accompanying claims.

The invention claimed is:

1. A computer-implemented method of simulating reservoir recovery, the method comprising:
   receiving a request including input parameters, the input parameters comprising a description of a reservoir model, a description of planned wells, and one or more tool codes respectively corresponding to a survey tool error model;
   computing an ideal recovery for the reservoir model based on the planned wells;
   computing a simulated recovery for the reservoir model at least one time for each tool code, further comprising:
      computing a wellbore trajectory in the reservoir model taking into account wellbore positional uncertainty specified by the survey tool error model; and
      computing the simulated recovery from the wellbore trajectory;
   computing a simulated recovery loss from a difference between the simulated recovery and the ideal recovery;
   computing an average recovery loss for at least one tool code from the simulated recovery loss; and
   at least one of causing a display of the average recovery loss to be updated and causing the average recovery loss to be stored in a non-transitory computer readable medium.

2. The method of claim 1, further comprising computing an expected wellbore crossover for the simulated recovery.

3. The method of claim 1, further comprising computing an expected wellbore collision for the simulated recovery.

4. The method of claim 1, further comprising computing an expected lease line crossing for the simulated recovery.

5. The method of claim 1, further comprising computing an expected vertical exit from a target zone of the reservoir for the simulated recovery.

6. The method of claim 1, wherein computing the simulated recovery further comprises representing a production profile of a wellbore trajectory with a Gaussian bell curve with inflection points defined by a drainage radius specified in the input parameters.

7. The method of claim 1, wherein computing the ideal recovery further comprises representing a production profile of a planned well with a Gaussian bell curve with inflection points defined by a drainage radius specified in the input parameters.

8. The method of claim 1, wherein computing the wellbore trajectory further comprises computing an azimuth error for the wellbore trajectory.

9. The method of claim 1, wherein computing the wellbore trajectory further comprises computing an inclination error for the wellbore trajectory.

10. Non-transitory computer readable media storing code executable by a processor for:
    receiving a request including input parameters for a recovery simulation, the input parameters comprising a description of a reservoir model, a description of planned wells, and one or more tool codes respectively corresponding to a survey tool error model;
    computing an ideal recovery for the reservoir model based on the planned wells;
    computing a simulated recovery for the reservoir model at least one time for each tool code, further comprising:
       computing a wellbore trajectory in the reservoir model taking into account wellbore positional uncertainly specified by the survey tool error model; and
       computing the simulated recovery from the wellbore trajectory;
    computing a simulated recovery loss from a difference between the simulated recovery and the ideal recovery;
    computing an average recovery loss for at least one tool code from the simulated recovery loss; and
    at least one of causing the average recovery loss to be displayed and causing the average recovery loss to be stored.

11. The computer readable media of claim 10, further comprising code for computing at least one of:
    a maximum recovery loss for a tool code from the simulated recovery loss;
    an expected wellbore collision for the simulated recovery;
    an expected wellbore crossover for the simulated recovery;
    an expected lease line crossing for the simulated recovery; and
    an expected vertical exit from a target zone of the reservoir model for the simulated recovery.

12. The computer readable media of claim 10, wherein computing the simulated recovery further comprises representing a production profile of a wellbore trajectory with a Gaussian bell curve with inflection points defined by a drainage radius specified in the input parameters.

13. The computer readable media of claim 10, wherein computing the ideal recovery further comprises representing a production profile of a planned well with a Gaussian bell curve with inflection points defined by a drainage radius specified in the input parameters.

14. The computer readable media of claim 10, wherein computing the wellbore trajectory further comprises computing an azimuth error for the wellbore trajectory.

15. The computer readable media of claim 10, wherein computing the wellbore trajectory further comprises computing an inclination error for the wellbore trajectory.

16. A system for simulating reservoir recovery, comprising:
    a processor enabled to:
    receive a request comprising a description of a reservoir model, a description of planned wells, and one or more tool codes respectively corresponding to one or more survey tool error models;
    compute an ideal recovery from the reservoir model based on the planned wells;
    compute a simulated recovery for the reservoir model at least one time for each survey tool error model, further comprising the processor enabled to:
       compute a wellbore trajectory in the reservoir model taking into account wellbore positional uncertainty specified by the survey tool error model; and
       compute the simulated recovery from the wellbore trajectory;
    compute a simulated recovery loss from a difference between the simulated recovery and the ideal recovery;
    compute an average recovery loss for a survey tool error model from the simulated recovery loss; and
    output a response indicating the average recovery loss.

17. The system of claim 16, wherein the processor is further enabled to compute at least one of:
- a maximum recovery loss for a survey tool error model from the simulated recovery loss;
- an expected wellbore collision for the simulated recovery;
- an expected wellbore crossover for the simulated recovery;
- an expected lease line crossing for the simulated recovery; and
- an expected vertical exit from a target zone of the reservoir model for the simulated recovery.

18. The system of claim 16, further comprising a client device, and wherein the processor is further enabled to receive the request from the client device.

19. The system of claim 16, further comprising a non-transitory computer readable medium storing computer readable code, and wherein the processor being enabled includes the processor accessing and executing the computer readable code.

* * * * *